United States Patent
Oh et al.

(10) Patent No.: US 9,443,917 B2
(45) Date of Patent: Sep. 13, 2016

(54) ORGANIC LIGHT-EMITTING DISPLAY APPARATUS AND METHOD OF MANUFACTURING THE SAME

(71) Applicant: Samsung Display Co., Ltd., Yongin, Gyeonggi-Do (KR)

(72) Inventors: Jae-Hwan Oh, Yongin (KR); Yeoung-Jin Chang, Yongin (KR); Seong-Hyun Jin, Yongin (KR); Se-Hun Park, Yongin (KR); Won-Kyu Lee, Yongin (KR); Jae-Beom Choi, Yongin (KR)

(73) Assignee: Samsung Display Co., Ltd. (KR)

( * ) Notice: Subject to any disclaimer, the term of this patent is extended or adjusted under 35 U.S.C. 154(b) by 160 days.

(21) Appl. No.: 14/051,262

(22) Filed: Oct. 10, 2013

(65) Prior Publication Data
US 2014/0346457 A1 Nov. 27, 2014

(30) Foreign Application Priority Data

May 21, 2013 (KR) .......................... 10-2013-0057298

(51) Int. Cl.
*H01L 27/32* (2006.01)

(52) U.S. Cl.
CPC .................................. *H01L 27/3258* (2013.01)

(58) Field of Classification Search
CPC ............. H01L 27/32; H01L 27/14603; H01L 27/14605; H01L 27/14612; H01L 27/3248; H01L 27/326
See application file for complete search history.

(56) References Cited

U.S. PATENT DOCUMENTS

| 2006/0012742 A1* | 1/2006 | Tsai | H01L 27/3248 349/139 |
| 2011/0220901 A1* | 9/2011 | Ha | H01L 27/3258 257/59 |
| 2013/0146878 A1 | 6/2013 | Oh et al. | |

FOREIGN PATENT DOCUMENTS

| JP | 2005-268046 | 9/2005 |
| JP | 2005-310591 | 11/2005 |
| KR | 10-2007-0051636 A | 5/2007 |
| KR | 10-2013-0066290 | 6/2013 |

* cited by examiner

*Primary Examiner* — Daniel Whalen
*Assistant Examiner* — Suberr Chi
(74) *Attorney, Agent, or Firm* — Innovation Counsel LLP

(57) ABSTRACT

Provided are an organic light-emitting display apparatus having superior light efficiency and ease of manufacture, as well as a method of manufacturing the same. The organic light-emitting display apparatus includes: a substrate; a pixel electrode disposed on a pixel region of the substrate; a first insulating layer that is interposed between the substrate and the pixel electrode and that has a first discontinuous region extending along at least a portion of an edge of the pixel electrode; an intermediate layer that is disposed on the pixel electrode and that includes an emission layer; and an opposite electrode that covers the intermediate layer and at least a portion of the first discontinuous region, so that a shortest distance to the substrate in at least a portion of the first discontinuous region is shorter than a shortest distance between the pixel electrode and the substrate.

13 Claims, 8 Drawing Sheets

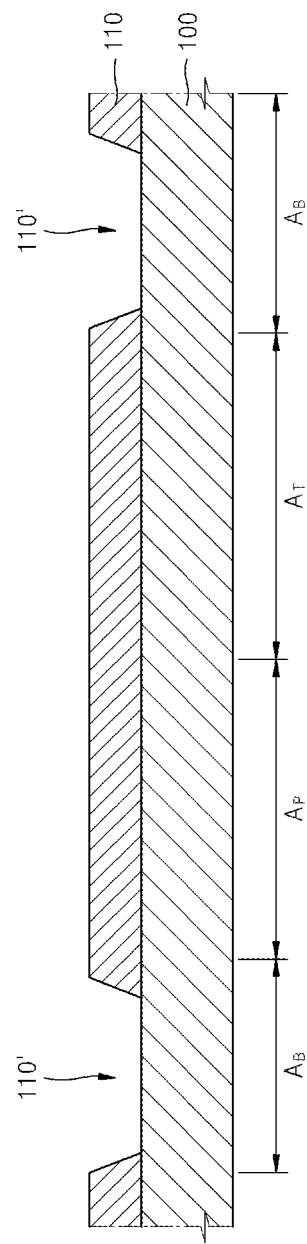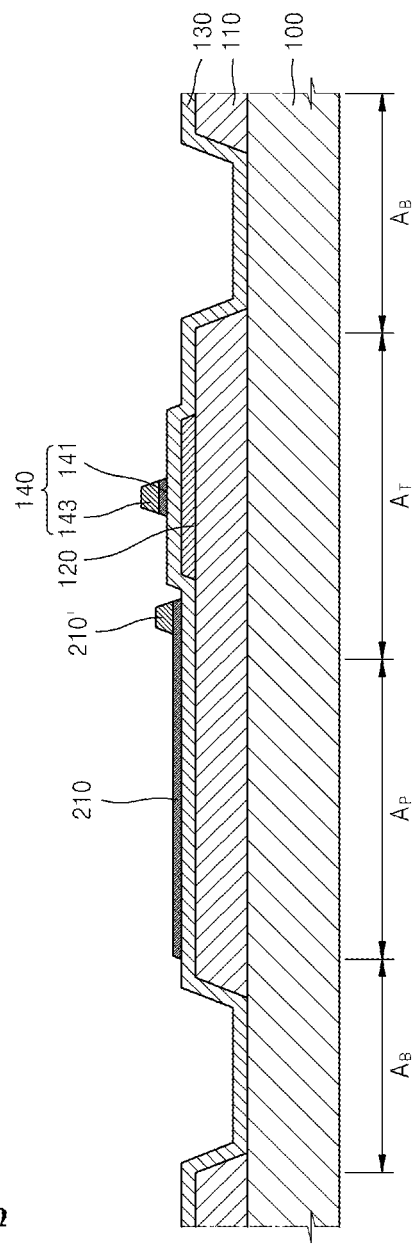

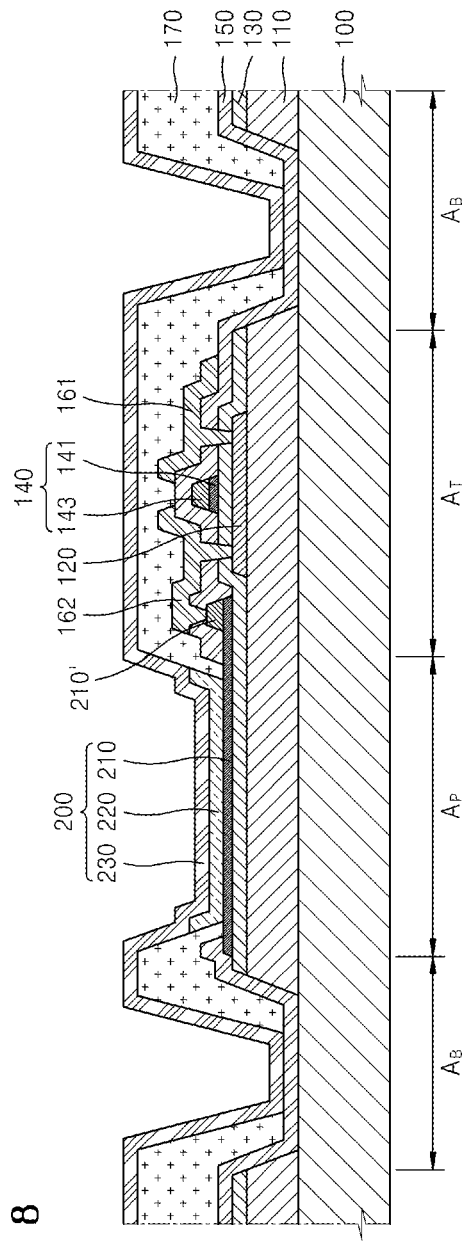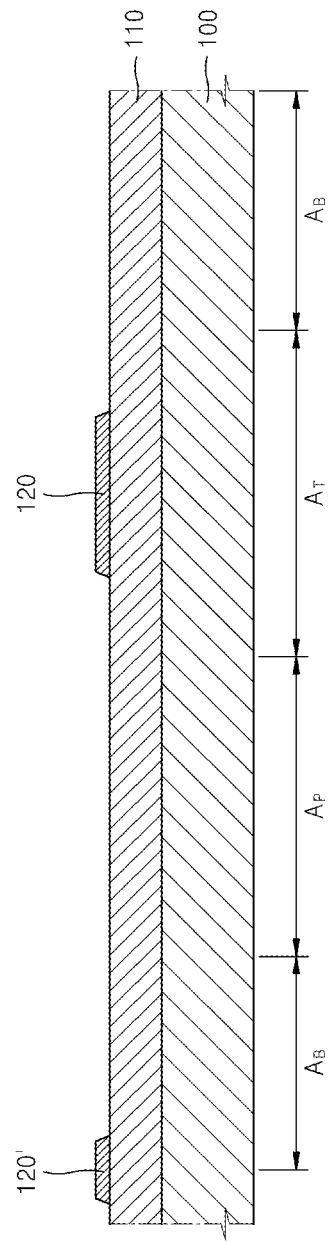

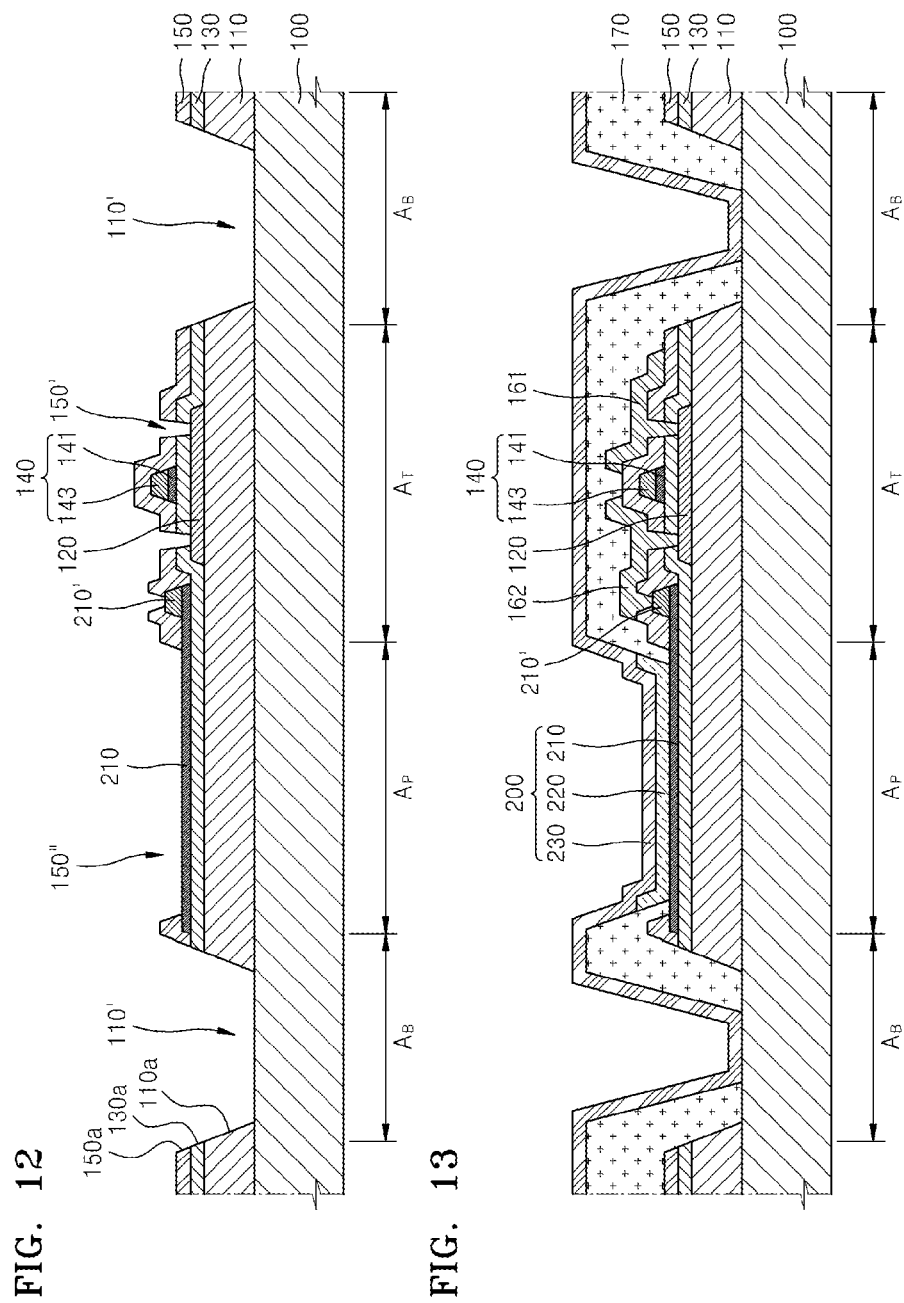

ORGANIC LIGHT-EMITTING DISPLAY APPARATUS AND METHOD OF MANUFACTURING THE SAME

CROSS-REFERENCE TO RELATED PATENT APPLICATION

This application claims priority to, and the benefit of, Korean Patent Application No. 10-2013-0057298 filed on May 21, 2013 in the Korean Intellectual Property Office, the disclosure of which is incorporated herein in its entirety by reference.

BACKGROUND OF THE INVENTION

1. Field of the Invention

One or more embodiments of the present invention relate generally to an organic light-emitting display apparatus and a method of manufacturing the same, and more particularly, to an organic light-emitting display apparatus having improved light efficiency and easier manufacture, as well as a method of manufacturing the same.

2. Description of the Related Art

Organic light-emitting display apparatuses typically employ an organic light-emitting device on a display region, wherein the organic light-emitting device includes a pixel electrode and an opposite electrode, which face each other, and an intermediate layer that is disposed between the pixel electrode and the opposite electrode, where this intermediate layer includes an emission layer.

In organic light-emitting devices, the emission layer of the intermediate layer generates light due to an electrical signal applied to the pixel electrode and the opposite electrode. Accordingly, the organic light-emitting device is termed a surface light-emitting device.

However, the conventional organic light-emitting display apparatus has low light efficiency. That is, about 40% of the light generated in the emission layer is not emitted to the exterior of the display, but is instead absorbed by the various layers of the display and emitted as heat.

SUMMARY OF THE INVENTION

One or more embodiments of the present invention provide an organic light-emitting display apparatus having superior light efficiency and ease of manufacture, as well as a method of manufacturing the same. However, embodiments of the present invention are examples only, and the present invention is not limited thereto.

According to an aspect of the present invention, there is provided an organic light-emitting display apparatus including: a substrate; a pixel electrode disposed on a pixel region of the substrate; a first insulating layer that is interposed between the substrate and the pixel electrode and that has a first discontinuous region extending along at least a portion of an edge of the pixel electrode, the first discontinuous region being a region in which material of the first insulating layer is not present; an intermediate layer that is disposed on the pixel electrode and that includes an emission layer; and an opposite electrode that covers the intermediate layer and at least a portion of the first discontinuous region, so that a shortest distance to the substrate in at least a portion of the first discontinuous region is shorter than a shortest distance between the pixel electrode and the substrate.

The organic light-emitting display apparatus may further include a dummy semiconductor layer that is interposed between the first insulating layer and the opposite electrode and that has a surface that is at least approximately coplanar with a surface of the first insulating layer that is exposed by the first discontinuous region. In this case, the dummy semiconductor layer may be disposed at an opposite end of the first discontinuous region as the pixel electrode.

The first insulating layer may be a buffer layer.

The organic light-emitting display apparatus may further include a second insulating layer that is interposed between the first insulating layer and the pixel electrode, and that has a second discontinuous region positioned to correspond to at least a portion of the first discontinuous region, the second discontinuous region being a region in which material of the second insulating layer is not present, wherein a shortest distance between the opposite electrode and the substrate in at least a portion of the second discontinuous region is shorter than a shortest distance between the pixel electrode and the substrate. In this case, the first insulating layer may be a buffer layer and the second insulating layer may be a gate insulating film.

The second discontinuous region is positioned to correspond to the first discontinuous region of the first insulating layer, and a surface of the second insulating layer that is exposed by the second discontinuous region is at least approximately coplanar with an edge surface of the first insulating layer that is exposed by the first discontinuous region.

The organic light-emitting display apparatus may further include a dummy semiconductor layer that is interposed between the first insulating layer and the second insulating layer, and that has a surface that is at least approximately coplanar with at least a portion of a surface of the first insulating layer that is exposed by the first discontinuous region.

The organic light-emitting display apparatus may further include a third insulating layer that is interposed between the second insulating layer and the pixel electrode, and that has a third discontinuous region positioned to correspond to at least a portion of the second discontinuous region, the third discontinuous region being a region in which material of the third insulating layer is not present, wherein a shortest distance between the opposite electrode and the substrate in at least a portion of the third discontinuous region is shorter than a shortest distance between the pixel electrode and the substrate. In this regard, the first insulating layer may be a buffer layer, the second insulating layer may be a gate insulating film, and the third insulating layer may be an interlayer insulating film.

Each of the second discontinuous region and the third discontinuous region corresponds to the first discontinuous region, and a surface of the second insulating layer that is exposed by the second discontinuous region and a surface of the third insulating layer that is exposed by the third discontinuous region are at least approximately coplanar with a surface of the first insulating layer that is exposed by the first discontinuous region.

The organic light-emitting display apparatus may further include a dummy semiconductor layer that is interposed between the first insulating layer and the second insulating layer, and that has a surface that is at least approximately coplanar with at least a portion of a surface of the first insulating layer that is exposed by the first discontinuous region.

The organic light-emitting display apparatus may further include a pixel-defining film that covers an edge of the pixel electrode to expose a central portion of the pixel electrode, and that has a fourth discontinuous region positioned to correspond to at least a portion of the first discontinuous region, the fourth discontinuous region being a region in which material of the pixel-defining film is not present, wherein the opposite electrode covers the pixel-defining film, and a shortest distance between the opposite electrode and the substrate in at least a portion of a fourth discontinuous region is shorter than a shortest distance between the pixel electrode and the substrate.

The opposite electrode may include a non-transmissible material, and light generated from the emission layer of the intermediate layer may be emitted toward the exterior of the display through the substrate.

According to another aspect of the present invention, there is provided a method of manufacturing an organic light-emitting display apparatus, wherein the method includes forming a first insulating layer having a discontinuous region extending along at least a portion of a boundary of a pixel region of a substrate on which a pixel electrode is to be formed, the discontinuous region of the first insulating layer being a region in which material of the first insulating layer is not present; forming a pixel electrode on a portion of the first insulating layer corresponding to the pixel region; forming an intermediate layer, including an emission layer, on the pixel electrode; and forming an opposite electrode to cover the intermediate layer, wherein a shortest distance between the opposite electrode and the substrate in at least a portion of the discontinuous region is shorter than a shortest distance between the pixel electrode and the substrate.

The forming a first insulating layer may further include: forming the first insulating layer on the substrate; forming a dummy semiconductor layer on the first insulating layer; and patterning the first insulating layer and the dummy semiconductor layer so that the first insulating layer has the discontinuous region extending along at least a portion of a boundary of a pixel region on which a pixel electrode is to be disposed.

According to another aspect of the present invention, there is provided a method manufacturing an organic light-emitting display apparatus, wherein the method includes: forming a first insulating layer on a substrate; forming a second insulating layer on the first insulating layer; patterning the first insulating layer and the second insulating layer so that each of the first insulating layer and the second insulating layer has a discontinuous region extending along at least a portion of a boundary of a pixel region on which a pixel electrode is to be formed, the discontinuous regions of the first insulating layer and the second insulating layer being, respectively, a region in which material of the first insulating layer is not present, and a region in which material of the second insulating layer is not present; forming the pixel electrode on a portion of the first insulating layer corresponding to the pixel region; forming an intermediate layer, including an emission layer, on the pixel electrode; and forming an opposite electrode to cover the intermediate layer, wherein a shortest distance between the opposite electrode and the substrate in at least a portion of the discontinuous region of the first insulating layer, and a shortest distance between the opposite electrode and the substrate in at least a portion of the discontinuous region of the second insulating layer are both shorter than a shortest distance between the pixel electrode and the substrate.

The method may further include forming a dummy semiconductor layer on the first insulating layer, wherein the forming a second insulating layer further includes forming a second insulating layer on the first insulating layer so as to cover the dummy semiconductor layer, and the patterning the first insulating layer and the second insulating layer further includes patterning the first insulating layer, the dummy semiconductor layer, and the second insulating layer so as to form the discontinuous region of the first insulating layer and the discontinuous region of the second insulating layer.

According to another aspect of the present invention, there is provided a method manufacturing an organic light-emitting display apparatus, wherein the method includes forming a first insulating layer on a substrate; forming a second insulating layer on the first insulating layer; forming a pixel electrode on a portion of the first insulating layer to correspond to the pixel region; forming a third insulating layer on the second insulating layer to cover the pixel electrode; patterning the first insulating layer, the second insulating layer, and the third insulating layer so that the third insulating layer has an opening exposing at least a central portion of the pixel electrode, and each of the first insulating layer, the second insulating layer, and the third insulating layer has a discontinuous region extending along at least a portion of a boundary of a pixel region on which a pixel electrode is to be located, wherein the discontinuous regions of the first, second, and third insulating layers are, respectively, regions in which material of the first, second, and third insulating layers are not present; forming an intermediate layer, including an emission layer, on the pixel electrode; and forming an opposite electrode to cover the intermediate layer, wherein respective shortest distances between the opposite electrode and the substrate in at least portions of the discontinuous regions of each of the first insulating layer, the second insulating layer, and the third insulating layer are shorter than a shortest distance between the pixel electrode and the substrate.

The method may further include forming a dummy semiconductor layer on the first insulating layer, wherein the forming a second insulating layer further includes forming a second insulating layer on the first insulating layer so as to cover the dummy semiconductor layer, and the patterning the first insulating layer, the second insulating layer, and the third insulating layer further includes patterning the dummy semiconductor layer, the first insulating layer, the second insulating layer, and the third insulating layer so as to form the discontinuous regions of the first, second, and third insulating layers respectively.

The method may further include forming a material layer for a pixel-defining film so as to cover the pixel electrode and to correspond to substantially the entire surface of the substrate; and patterning the material layer for a pixel-defining film to form a pixel-defining film that covers an edge of the pixel electrode and that exposes at least a central portion of the pixel electrode, and that has a discontinuous region positioned to correspond to at least a portion of the discontinuous region of the first insulating layer.

The forming of the opposite electrode may be performed by using a non-transmissible material.

BRIEF DESCRIPTION OF THE DRAWINGS

The above and other features and advantages of the present invention will become more apparent by describing in detail exemplary embodiments thereof with reference to the attached drawings in which:

FIGS. 1 to 5 are schematic cross-sectional views that illustrate processes of a method of manufacturing an organic light-emitting display apparatus, according to an embodiment of the present invention;

FIGS. 7 to 8 are schematic cross-sectional views that illustrate processes of a method of manufacturing an organic light-emitting display apparatus according to another embodiment of the present invention;

FIGS. 9 to 11 are schematic cross-sectional views that illustrate processes of a method of manufacturing an organic light-emitting display apparatus according to another embodiment of the present invention; and FIGS. 12 to 13 are schematic cross-sectional views that illustrate processes of a method of manufacturing an organic light-emitting display apparatus according to another embodiment of the present invention.

DETAILED DESCRIPTION OF THE INVENTION

Figure 3:
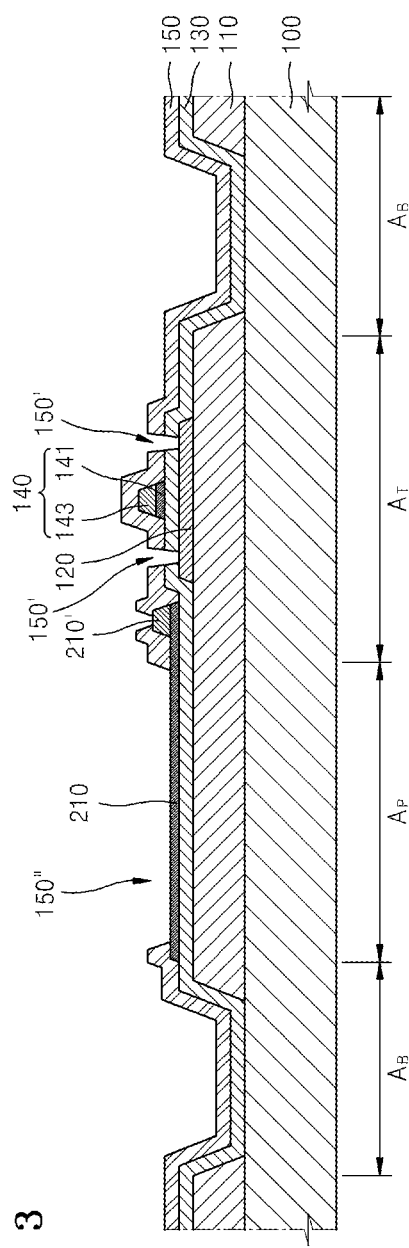

Hereinafter, embodiments of the present invention will be described in detail with reference to accompanying drawings. However, the present invention is not limited to the embodiments, and these embodiments are provided so that this disclosure will be thorough and complete, and will fully convey the concept of the invention to those skilled in the art. Also, for convenience of description, the size of constituting elements in the drawings may be exaggerated. Also, the size of constituting elements in the drawings is only an example for convenience of description. Accordingly, the present invention is not limited thereto.

Also, in the following description, when a constituent element, such as a layer, a film, a region, or a plate, is described to exist on another constituent element, the constituent element may exist directly on the other constituent element or another constituent element may be interposed therebetween.

As used herein, the term "and/or" includes any and all combinations of one or more of the associated listed items. Expressions such as "at least one of," when preceding a list of elements, modify the entire list of elements and do not modify the individual elements of the list.

FIGS. 1 to 5 are schematic cross-sectional views that illustrate processes of a method of manufacturing an organic light-emitting display apparatus, according to an embodiment of the present invention.

As illustrated in FIG. 1, a first insulating layer 110 is formed on a substrate 100, and a portion of the first insulating layer 110 is patterned such that the first insulating layer 110 has a first discontinuous region 110', i.e. a hole or other area in which no material of the first insulating layer 110 is present. In detail, the first insulating layer 110 has the first discontinuous region 110' corresponding to at least a portion of a path running along an outer circumference of a pixel region $A_P$ on which a pixel electrode is to be located. In FIG. 1, the first discontinuous region 110' of the first insulating layer 110 is formed by completely removing a portion of the first insulating layer 110 corresponding to a discontinuous region $A_B$ of the substrate 100. However, even when the portion of the first insulating layer 110 is partially removed to form a groove, the first insulating layer 110 is still considered to have a discontinuous region. This is the same in the following embodiments and modified embodiments thereof. According to another embodiment, instead of patterning the formed first insulating layer 110, the first insulating layer 110 may simply be formed with a first discontinuous region 110' to begin with.

The substrate 100 may be formed of various materials including a glass material, a metal material, or a plastic material such as polyethylene terephthalate (PET), polyethylene naphthalate (PEN), polyimide, or the like. The substrate 100 may have, as described above, the discontinuous region $A_B$, the pixel region $A_P$ on which a pixel electrode is to be located, and a thin film transistor region $A_T$ on which a thin film transistor is to be located. The first insulating layer 110 formed on the substrate 100 may be a buffer layer that protects devices formed thereon from external impurities, and may be formed of, for example, silicon oxide and/or silicon nitride. If desired, for use as the first insulating layer 110, an organic insulating material, such as polyethylene terephthalate (PET), polyethylene naphthalate (PEN), polyacrylate, or polyimide may be used.

Thereafter, as illustrated in FIG. 2, a semiconductor layer 120 is formed on the thin film transistor region $A_T$, a second insulating layer 130 is formed on the entire surface of the substrate 100 to cover the resultant structure, and a gate electrode 140 is formed on the second insulating layer 130. Herein, the second insulating layer 130 is a gate insulating film that electrically insulates the semiconductor layer 120 from the gate electrode 140, and may be formed of silicon oxide, silicon nitride, or other insulating organic and/or inorganic materials. When the first insulating layer 110 has a discontinuous region as described above, the second insulating layer 130 may contact, i.e. extend across, or have material located within, the discontinuous region $A_B$ of the substrate 100.

The gate electrode 140 may include, as illustrated, a first gate electrode 141 formed of a transmissible conductive material and a second gate electrode 143 formed of a highly conductive material and formed on the first gate electrode 141. When the first gate electrode 141 is formed on the thin film transistor region $A_T$, a pixel electrode 210 may be simultaneously formed of the same material as the first gate electrode 141, and formed on the pixel region A. Also, when the second gate electrode 143 is formed, an auxiliary electrode 210' may be formed of the same material as the second gate electrode 143, and formed on a portion of the pixel electrode 210.

The first gate electrode 141 may be formed of, for example, indium tin oxide (ITO), indium zinc oxide (IZO), zinc oxide (ZnO), indium oxide ($In_2O_3$), indium gallium oxide (IGO), or aluminum zinc oxide (AZO). The second gate electrode 143 may be a single- or multi-layer structure, and may be formed of at least one material selected from aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), molybdenum (Mo), titanium (Ti), tungsten (W), and copper (Cu), or an alloy thereof.

Hereinafter, as illustrated in FIG. 3, a third insulating layer 150 is formed to correspond to the entire surface of the substrate 100 so as to cover the pixel electrode 210 and the gate electrode 140. The third insulating layer 150 is then patterned to form a contact hole 150' exposing a portion of the semiconductor layer 120 and an opening 150" exposing at least a portion of the pixel electrode 210. The third insulating layer 150 may be an interlayer insulating film, and may be formed of silicon oxide, silicon nitride, and/or other insulating organic and inorganic materials.

Figure 4:
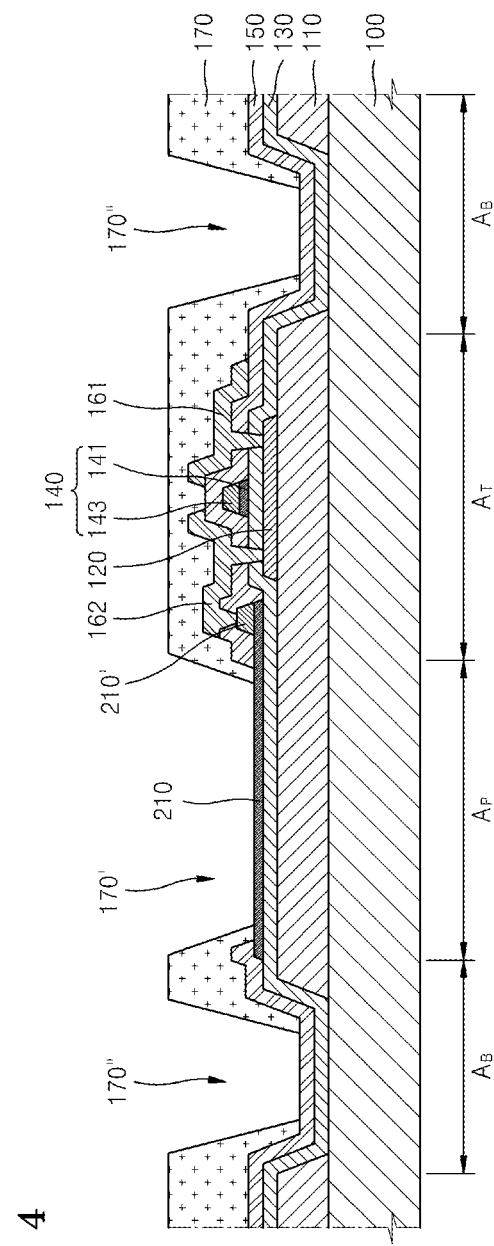

Then, as illustrated in FIG. 4, source and drain electrodes 161 and 162 are formed, after which a pixel-defining film 170 is formed.

First, the source and drain electrodes 161 and 162 are formed through respective contact holes to contact the semiconductor layer 120. In consideration of conductivity, the source and drain electrodes 161 and 162 may each be a single- or multi-layer structure, formed of at least one material selected from aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), molybdenum (Mo), titanium (Ti), tungsten (W), and copper (Cu), or an alloy thereof.

Thereafter, the pixel-defining film 170 (having a single- or multi-layer structure formed of an organic material such as polyacrylate or polyimide, or an inorganic material) is formed to expose at least a central portion of the pixel electrode 210 through an opening 170'. In this regard, the pixel-defining film 170 may be formed to have, in addition to the opening 170' of the pixel region $A_P$ exposing a central portion of the pixel electrode 210, a fourth discontinuous region 170" that is an opening exposing at least a portion of the third insulating layer 150 disposed under the pixel-defining film 170 in the discontinuous region $A_B$.

The opening 170' of the pixel-defining film 170 exposes at least the central portion of the pixel electrode 210 so as to define a pixel. Also, the pixel-defining film 170 may contribute to an increase in a distance between an edge of the pixel electrode 210 and an opposite electrode (see 230, FIG. 5) disposed above the pixel electrode 210, so as to prevent the occurrence of, for example, an electrical arc on the edge of the pixel electrode 210.

Figure 5:
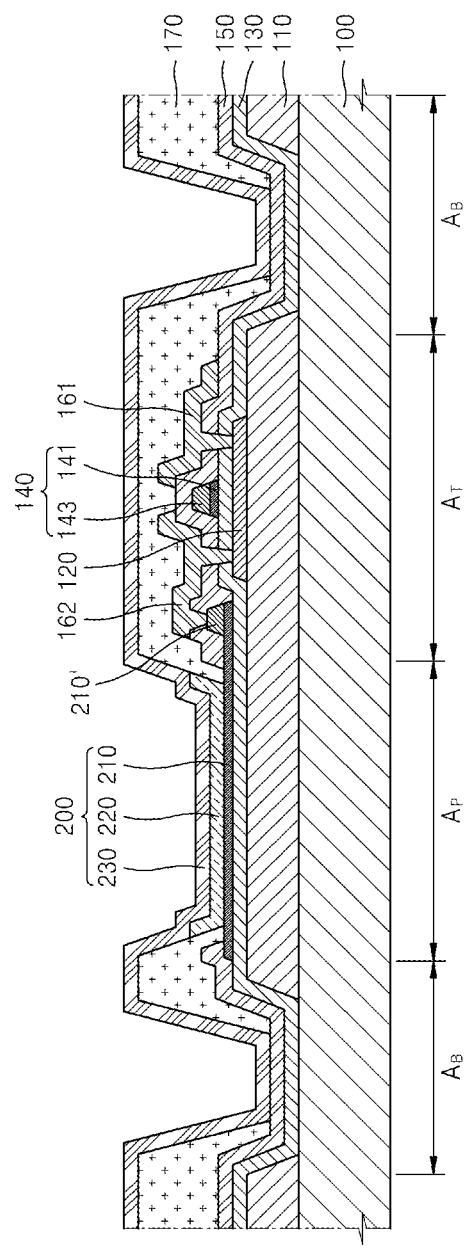

Thereafter, an intermediate layer 220 including an emission layer (EML) is formed, and then an opposite electrode 230 is formed to correspond to at least the pixel electrode 210, for example, most regions of the substrate 100, thereby completing the manufacturing of an organic light-emitting display apparatus as illustrated in FIG. 5.

The intermediate layer 220 disposed between the pixel electrode 210 and the opposite electrode 230 may be formed of a low molecular weight material or a polymer. When the intermediate layer 220 is formed of a low molecular weight material, the intermediate layer 220 may be formed by stacking at least one of a hole injection layer (HIL), a hole transport layer (HTL), an EML, an electron transport layer (ETL), and an electron injection layer (EIL). An available organic material herein may be copper phthalocyanine (CuPc), N,N'-di(naphthalene-1-yl)-N,N'-diphenyl-benzidine (NPB), or tris-8-hydroxyquinoline aluminum (Alq3), but it is not limited thereto. These layers may be formed by, for example, vacuum deposition or laser-induced thermal imaging (LITI).

When the intermediate layer 220 is formed of a polymer, the intermediate layer 220 may include an HTL and an EML. The HTL may be formed, for example, of poly-(3,4)-ethylene-dihydroxy thiophene (PEDOT) or polyaniline (PANI), and the EML may be formed of, for example, a polymer material, such as a poly-phenylene vinylene (PPV)-based polymer or a polyfluorene-based polymer. These layers may be formed by, for example, screen printing, ink-jet printing, or LITI.

The intermediate layer 220 is not limited thereto, and may have various other structures. Also, the layers of the intermediate layer 220 may not necessarily be shaped to correspond to the pixel electrode 210, and some of the layers may be integrally formed as one body without patterning on the entire display region.

The opposite electrode 230 may be integrally formed as one body without patterning in a plurality of pixels, i.e., as a common electrode, to cover a display region (active region). Herein, the display region refers to a region in which light is emitted in an organic light-emitting display apparatus and, for example, may refer to all the regions (excluding an edge of an organic light-emitting display apparatus) on which, for example, a controller is to be located. When the entire surface of an organic light-emitting display apparatus lacks a dead area (i.e. a dead area is not present), the display region may be the entire surface of the organic light-emitting display apparatus.

The opposite electrode 230 may contact an electrode power supply line outside the display region to receive an electrical signal transmitted via the electrode power supply line. The opposite electrode 230 may be a layer containing at least one material selected from Li, Ca, LiF/Ca, LiF/Al, Al, Ag, and Mg to act as a reflection plate that reflects incident light. However, the structure of and the material of the opposite electrode 230 are not limited thereto, and may vary.

As described above, in an organic light-emitting device 200, in response to an electrical signal applied to the pixel electrode 210 and the opposite electrode 230, the EML of the intermediate layer 220 generates light. Accordingly, the organic light-emitting device 200 is a surface light-emitting device. That is, since the organic light-emitting device 200 is a surface light-emitting device, the light generated in the EML progresses in all directions, including a direction toward the substrate 100. Accordingly, brightness is relatively low on the front side of an organic light-emitting display apparatus, and about 40% of the light generated in the EML is not transmitted to the outside of the device, and is instead consumed as heat. In particular, when a non-transmissible (opaque) opposite electrode is included instead of a light-transmissible opposite electrode and the light generated in the EML is emitted toward the outside through the substrate 100, that is, when the organic light-emitting display apparatus 200 is a bottom-emission type organic light-emitting display apparatus, the light needs to pass through a plurality of layers before it is emitted to the outside of the device, and thus, loss of light is high.

However, in an organic light-emitting display apparatus manufactured according to the present embodiment, in at least a portion of the discontinuous region $A_B$, a shortest distance (i.e. the distance as measured along a normal to the electrode 230) between the opposite electrode 230 and the substrate 100 is shorter than a shortest distance between the pixel electrode 210 and the substrate 100 due to the fourth discontinuous region 170" of the pixel-defining film 170. Accordingly, of light emitted from the EML included in the intermediate layer 220 between the pixel electrode 210 and the opposite electrode 230, light that is emitted toward not the substrate 100 but the side of the organic light-emitting display apparatus is reflected by the opposite electrode 230 on the discontinuous region $A_B$ to progress toward a front side of the substrate 100. Accordingly, light extraction efficiency is increased, and thus the brightness in the front side of the organic light-emitting display apparatus may be substantially increased. Accordingly, even if the organic light-emitting device 200 is a surface light-emitting device, an organic light-emitting display apparatus having high brightness at the front side thereof may be embodied.

Also, even if light generated in a pixel (sub-pixel) may progress toward an adjacent pixel (sub-pixel), the light may be reflected by the opposite electrode 230 on the discontinuous region $A_B$ to progress to the front side of the substrate 100. Accordingly, although in the case of a conventional organic light-emitting display apparatus, blurring, such as mixing of color, may occur between adjacent pixels (sub-pixels), in the case of an organic light-emitting display apparatus manufactured according to the present embodiment, blurring may be effectively reduced.

Figure 6:
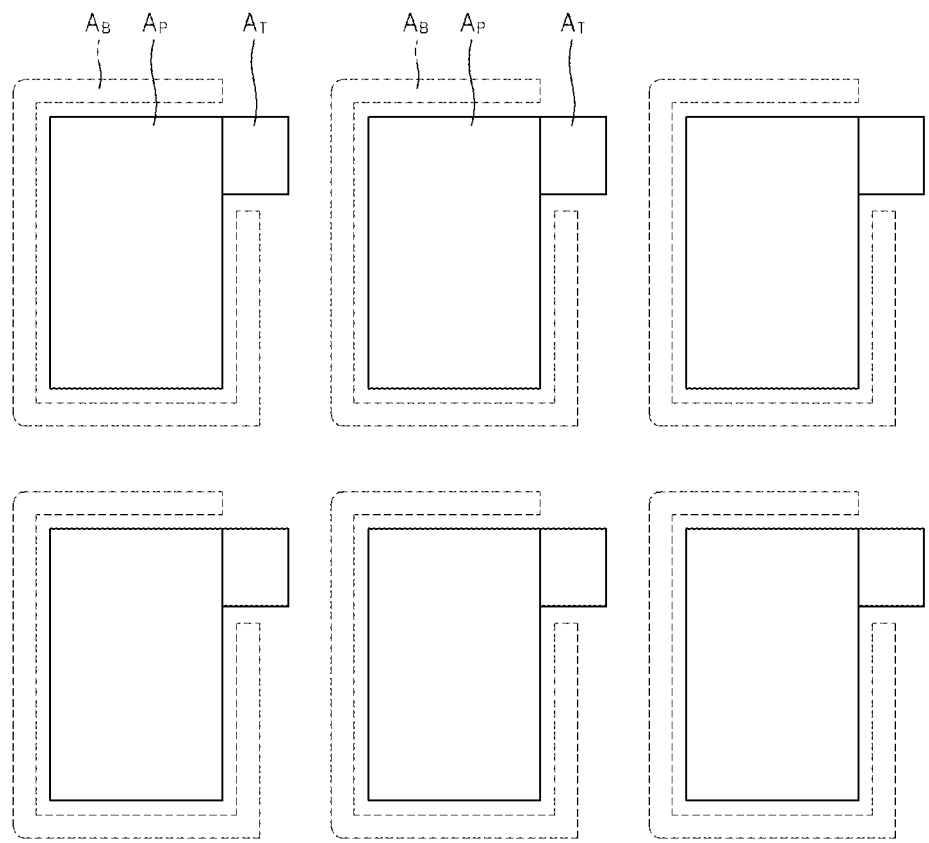
FIG. 6 is a conceptual plan view of a portion of an organic light-emitting display apparatus manufactured according to a method of manufacturing an organic light-emitting display apparatus of an embodiment of the present invention.

FIG. 6 is a conceptual plan view of a portion of an organic light-emitting display apparatus manufactured according to a method of the present invention. As illustrated in FIG. 6, a discontinuous region $A_B$ may incompletely surround the pixel region $A_P$. That is, the discontinuous region $A_B$ may only partially surround the pixel region $A_P$. The pixel electrode 210 is electrically connected to a thin film transistor. When constituents of at least a portion of a thin film transistor (for example, a gate electrode) are located on the same plane as the pixel electrode 210 as illustrated in FIG. 5, parts of the discontinuous region $A_B$ may not be positioned between a pixel region $A_P$ and a thin film transistor region $A_T$ in order to ensure the electrical connection between the pixel electrode 210 and the thin film transistor. Also, unlike the illustrated structures, adjacent pixel regions $A_P$ may share a discontinuous region $A_B$. As described above, the shape of the discontinuous region $A_B$ may vary.

Figure 7:
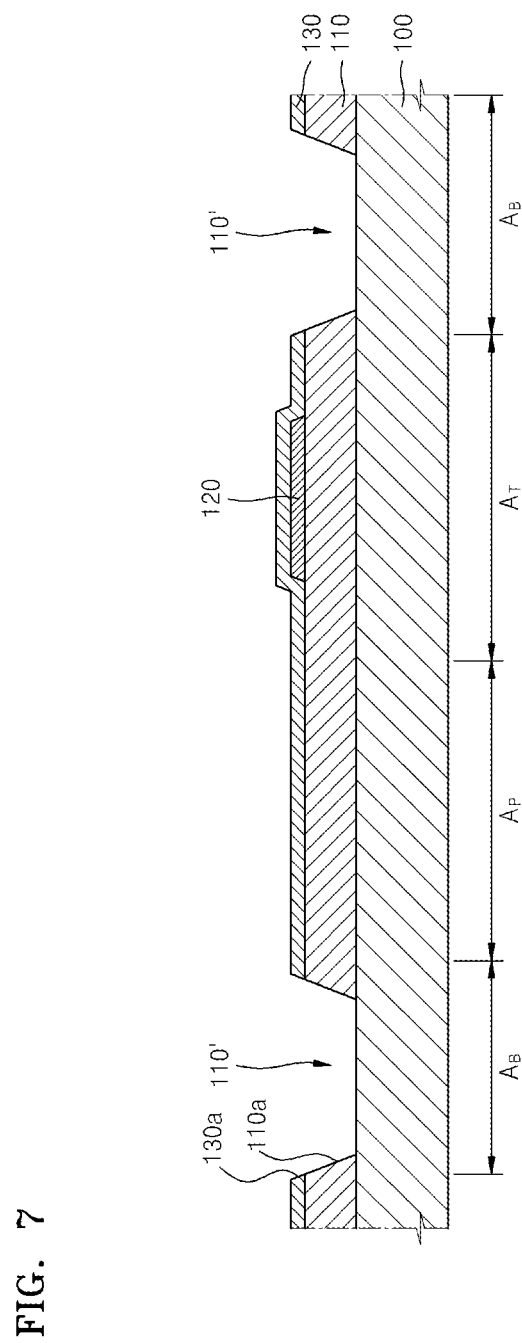

FIGS. 7 to 8 are schematic cross-sectional views that illustrate processes of a method of manufacturing an organic light-emitting display apparatus, according to another embodiment of the present invention.

According to the present embodiment, as illustrated in FIG. 7, a first insulating layer 110, which is a buffer layer, is formed to correspond to the entire region of the substrate 100. A semiconductor layer 120, which has a pattern, is formed on the first insulating layer 110, and then a second insulating layer 130 is formed over the entire upper surface of the substrate 100, to cover the semiconductor layer 120 on the first insulating layer 110.

Thereafter, the first insulating layer 110 and the second insulating layer 130 are simultaneously patterned to form a discontinuous region for each of the first insulating layer 110 and the second insulating layer 130 (i.e. a region in which neither material of the first insulating layer 110 nor that of the second insulating layer 130 is present), as illustrated in FIG. 7. That is, the first insulating layer 110 and the second insulating layer 130 are patterned such that the first insulating layer 110 and the second insulating layer 130 each have a discontinuous region along at least a portion of a path running along an outer circumference or edge of the pixel region $A_P$. Accordingly, the second insulating layer 130 may have a second discontinuous region corresponding to a first discontinuous region 110' of the first insulating layer 110. In this regard, an edge surface 130a of the second insulating layer 130 that is exposed by the second discontinuous region of the second insulating layer 130 may be flush with an edge surface 110a of the first insulating layer 110 that is exposed by the first discontinuous region 110'. That is, the two edges of the layers 110, 130 extend parallel to each other in the region 110, so that no step discontinuity is present in region 110. Thus, in the cross-section shown, edges of each of these surfaces lie substantially collinear with each other. In a more general case, the two edge surfaces can be two parts of a single continuous surface of any shape or profile.

Then, as illustrated in FIG. 8, a pixel electrode 210, a gate electrode 140, a third insulating layer 150, which is an interlayer-insulating film, and source and drain electrodes 161 and 162 are formed on the second insulating layer 130, and then a pixel-defining film 170 is formed. The pixel-defining film 170 may be formed to have, in addition to an opening on the pixel region $A_P$ exposing at least a central portion of the pixel electrode 210, a fourth discontinuous region that is an opening exposing at least a portion of the third insulating layer 150 in the discontinuous region $A_B$. Thereafter, an intermediate layer 220 (including an EML) is formed, and then an opposite electrode 230 is formed to correspond to (or be positioned over) at least the pixel electrode 210 and, for example, over most or substantially all of the substrate 100, thereby completing the manufacturing of an organic light-emitting display apparatus as illustrated in FIG. 8.

In an organic light-emitting display apparatus manufactured as described above, a distance between the opposite electrode 230 and the substrate 100 in at least a portion of the discontinuous region $A_B$ may be shorter than the distance between the opposite electrode 230 and the substrate 100 in at least a portion of the discontinuous region $A_B$ of an organic light-emitting display apparatus manufactured according to the method of the previous embodiment described in connection with FIG. 5. Accordingly, the distance between the opposite electrode 230 and the substrate 100 in at least a portion of the discontinuous region $A_B$ is much shorter than the distance between the pixel electrode 210 and the substrate 100, and thus, light that is emitted toward not the substrate 100 but the side of the organic light-emitting display apparatus is more effectively reflected by the opposite electrode 230 in the discontinuous region $A_B$, so as to be redirected toward a front side of the substrate 100. Accordingly, light extraction efficiency is increased and thus, the brightness in the front side of the organic light-emitting display apparatus may be substantially increased. Also, in the case of an organic light-emitting display apparatus manufactured according to the present embodiment, blurring may be more effectively reduced, as described above.

Figure 10:
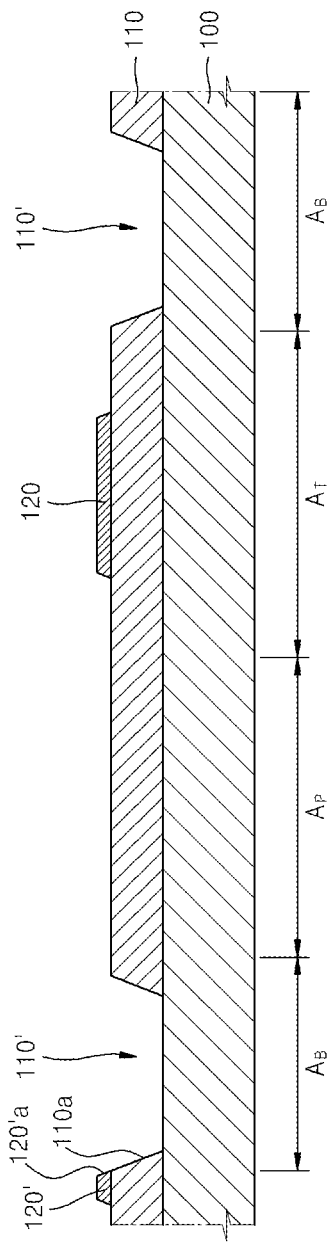
Figure 11:
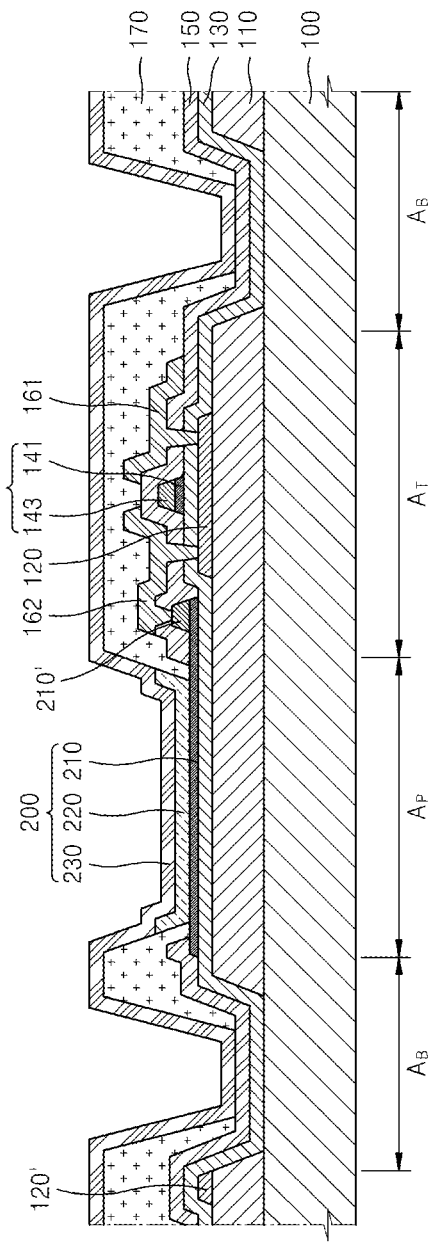

FIGS. 9 to 11 are schematic cross-sectional views that illustrate processes of a method of manufacturing an organic light-emitting display apparatus, according to another embodiment of the present invention.

In the method of manufacturing an organic light-emitting display apparatus, according to the present embodiment, as illustrated in FIG. 9, a first insulating layer 110, which is a buffer layer, is formed to correspond to the entire (or substantially entire) surface of a substrate 100, and a semiconductor layer 120, which has a pattern, is formed on a portion of the first insulating layer 110 corresponding to a thin film transistor region $A_T$. In this regard, a patterned dummy semiconductor layer 120' is simultaneously formed on a portion of the first insulating layer 110 corresponding to a discontinuous region $A_B$. It is not necessary that the dummy semiconductor layer 120' is formed on the entire discontinuous region $A_B$, and for example, as illustrated in FIG. 9, the dummy semiconductor layer 120' may be formed only on a portion of the discontinuous region $A_B$.

Thereafter, as illustrated in FIG. 10, the first insulating layer 110 and the dummy semiconductor layer 120' are simultaneously patterned to form a first discontinuous region 110' in the first insulating layer 110. That is, the first insulating layer 110 and the dummy semiconductor layer 120' are patterned such that the first discontinuous region 110' of the first insulating layer 110 is formed along at least a portion of a path running along an outer circumference of a pixel region $A_P$ on which a pixel electrode is to be located. Accordingly, the dummy semiconductor layer 120' has an edge surface 120'a that is flush with at least a portion of an edge surface 110a of the first insulating layer 110 that is exposed by the first discontinuous region 110'. Thus, in the cross-section shown, these edge surfaces are substantially coplanar. In a more general case, the two edge surfaces can be two parts of a single continuous surface of any shape or profile.

Then, as illustrated in FIG. 11, a second insulating layer 130, which is a gate insulating film, is formed to cover the semiconductor layer 120 and the dummy semiconductor layer 120'. Next, a pixel electrode 210, a gate electrode 140, a third insulating layer 150 which is an interlayer-insulating film, and source and drain electrodes 161 and 162 are formed on the second insulating layer 130, and then a pixel-defining film 170 is formed. The pixel-defining film 170 may be formed to have, in addition to an opening of the pixel region $A_P$ exposing at least a central portion of the pixel electrode 210, a fourth discontinuous region that is an opening exposing at least a portion of the third insulating layer 150 in the discontinuous region $A_B$. Thereafter, an intermediate layer 220, including an EML, is formed, and then an opposite electrode 230 is formed to correspond to at least the pixel electrode 210, for example, the majority of, or perhaps the display area of, the substrate 100, thereby completing the manufacturing of an organic light-emitting display apparatus as illustrated in FIG. 11.

In an organic light-emitting display apparatus manufactured as described above, on at least a portion of the discontinuous region $A_B$, a distance between the opposite electrode 230 and the substrate 100 is shorter than a distance between the pixel electrode 210 and the substrate 100. Accordingly, of light generated from the EML included in the intermediate layer 220 between the pixel electrode 210 and the opposite electrode 230, light that is emitted toward not the substrate 100 but the side of the organic light-emitting display apparatus may be effectively reflected by the opposite electrode 230 at the discontinuous region $A_B$ so as to be redirected toward a front side of the substrate 100. Accordingly, light extraction efficiency is increased and thus, the brightness at the front side of the organic light-emitting display apparatus may be substantially increased. Also, in the case of an organic light-emitting display apparatus manufactured according to the present embodiment, blurring may be more effectively reduced.

Also, in the case of an organic light-emitting display apparatus manufactured according to the present embodiment, the dummy semiconductor layer 120' exists on at least a portion of the discontinuous region $A_B$. Due to the dummy semiconductor layer 120', the occurrence of blurring may be more effectively prevented.

In more detail, the dummy semiconductor layer 120' may include polysilicon, which has a transmission rate of about 50% with respect to visible light and thus may effectively block the passage of light. In particular, since the absorption rate thereof with respect to light having a wavelength of 300 nm to 500 nm is high, a side light leak phenomenon may be efficiently prevented. Some of the light that is generated in an EML of the intermediate layer 220 may be scattered along, or between, the first insulating layer 110 and/or the second insulating layer 130. The dummy semiconductor layer 120' including polysilicon may absorb at least a portion of this scattered light, thereby effectively preventing the occurrence of blurring.

Also, the dummy semiconductor layer 120' may be used in the method of manufacturing an organic light-emitting display apparatus described in connection with FIGS. 7 and 8. That is, as illustrated in FIG. 7, instead of the patterning the first insulating layer 110 and the second insulating layer 130 after the formation thereof, a dummy semiconductor layer is disposed on the discontinuous region $A_B$ between the first insulating layer 110 and the second insulating layer 130, and then the first insulating layer 110, the dummy semiconductor layer, and the second insulating layer 130 are simultaneously patterned to form a first discontinuous region 110' and to make the dummy semiconductor layer or the second insulating layer 130 have an edge surface corresponding to at least a portion of the edge surface 110a of the first insulating layer 110.

FIGS. 12 to 13 are schematic cross-sectional views that illustrate processes of a method of manufacturing an organic light-emitting display apparatus, according to another embodiment of the present invention.

According to this embodiment, as illustrated in FIG. 12, a first insulating layer 110, which is a buffer layer, is formed to correspond to the entire or substantially the entire region of the substrate 100. Then, a semiconductor layer 120, which has a pattern, is formed on the first insulating layer 110, and a second insulating layer 130, which is a gate insulating layer, is formed over the semiconductor layer 120 and the first insulating layer 110 to cover the entire surface of the substrate 100 (or perhaps the entire or substantially the entire display area thereof). Next, a pixel electrode 210 and a gate electrode 140 are formed, and a third insulating layer 150, which is an interlayer-insulating film, is formed to cover the pixel electrode 210 and the gate electrode 140.

Thereafter, the first insulating layer 110, the second insulating layer 130, and the third insulating layer 150 are simultaneously patterned to form a discontinuous region in each of the first insulating layer 110, the second insulating layer 130, and the third insulating layer 150, as illustrated in FIG. 12. That is, the first insulating layer 110, the second insulating layer 130, and the third insulating layer 150 are patterned such that the first insulating layer 110, the second insulating layer 130, and the third insulating layer 150 each have a discontinuous region along at least a portion of a path running along an outer circumference or edge of the pixel region $A_P$. Accordingly, the second insulating layer 130 may have a second discontinuous region corresponding to the first discontinuous region 110' of the first insulating layer 110, and the third insulating layer 150 may have a third discontinuous region corresponding thereto. In this regard, an edge surface 130a of the second insulating layer 130 that is exposed by the second discontinuous region of the second insulating layer 130, and an edge surface 150a of the third insulating layer 150 that is exposed by the third discontinuous region of the third insulating layer 150, may be flush with an edge surface 110a of the first insulating layer 110, that is, exposed by the first discontinuous region 110' of the first insulating layer 110. Thus, in the cross-section shown, edges of each of these surfaces lie substantially collinear with each other. In a more general case, these three edge surfaces can be three different parts of a single continuous surface of any shape or profile.

As described above, the forming of a discontinuous region of the first insulating layer 110, the second insulating layer 130, and the third insulating layer 150 may be performed simultaneously together with the forming of both a contact hole 150' exposing a portion of the semiconductor layer 120, and an opening 150" exposing at least a portion of the pixel electrode 210.

Then, as illustrated in FIG. 13, source and drain electrodes 161 and 162 are formed on the third insulating layer 150, and then a pixel-defining film 170 is formed. The pixel-defining film 170 may be formed to have, in addition to an opening in the pixel region $A_P$ exposing the portion of the pixel electrode 210, a fourth discontinuous region in the discontinuous region $A_B$ exposing at least a portion of the substrate 100. Thereafter, an intermediate layer 220, including an EML, is formed, and then an opposite electrode 230 is formed to correspond to at least the pixel electrode 210, for example, formed over most regions of the substrate 100 or perhaps at least all or substantially all of the display area thereof, thereby completing the manufacturing of an organic light-emitting display apparatus as illustrated in FIG. 13.

In an organic light-emitting display apparatus manufactured as described above, a distance between the opposite electrode 230 and the substrate 100 in at least a portion of a discontinuous region $A_B$ may be shorter than the distance between the opposite electrode 230 and the substrate 100 in at least a portion of the corresponding discontinuous region $A_B$ of the display of the previous embodiments described in connection with FIG. 5 or FIG. 8. Accordingly, the distance between the opposite electrode 230 and the substrate 100 in at least a portion of the discontinuous region $A_B$ is much shorter than the distance between the pixel electrode 210 and the substrate 100, and thus, light that is emitted toward not the substrate 100 but the side of the organic light-emitting display apparatus is more effectively reflected by the opposite electrode 230 on the discontinuous region $A_B$ to be redirected toward a front side of the substrate 100. Accordingly, light extraction efficiency is increased and thus, the brightness in the front side of the organic light-emitting display apparatus may be substantially increased. Also, in the case of an organic light-emitting display apparatus manufactured according to the present embodiment, blurring may be more effectively reduced.

Also, as a method of manufacturing an organic light-emitting display apparatus, according to another embodiment of the present invention, the forming of a dummy semiconductor layer may be further included in the methods of manufacturing an organic light-emitting display apparatus described in connection with FIGS. 12 and 13. That is, as illustrated in FIG. 12, instead of the patterning the first insulating layer 110, the second insulating layer 130, and the third insulating layer 150 on the discontinuous region $A_B$, a dummy semiconductor layer is disposed between the first insulating layer 110 and the second insulating layer 130, and then the first insulating layer 110, the dummy semiconductor layer, the second insulating layer 130, and the third insulating layer 150 are all simultaneously patterned to form a first discontinuous region 110' in the first insulating layer 110 and to make the dummy semiconductor layer, the second insulating layer 130, and/or the third insulating layer 150 have edge surfaces each corresponding to at least a portion of the edge surface 110a of the first insulating layer 110. In this regard, the dummy semiconductor layer may be simultaneously formed together with a semiconductor layer formed on the thin film transistor region $A_T$.

Hereinbefore, methods of manufacturing an organic light-emitting display apparatus, according to embodiments of the present invention, have been described, but the present invention is not limited thereto. That is, an organic light-emitting display apparatus is also included in the scope of the present invention. In connection, it is also noted that any one or more features of any of the above described embodiments may be utilized in any other embodiment. That is, the invention contemplates embodiments including any combination or permutation of any of the individual features of any of the above described embodiments.

An organic light-emitting display apparatus according to an embodiment of the present invention may have a structure illustrated in FIG. 5. That is, the organic light-emitting device according to the present embodiment may include, as a buffer layer, the first insulating layer 110 that is disposed between the substrate 100 and the pixel electrode 210 and that has the first discontinuous region 110' along at least a portion of a path running along an outer circumference of the pixel electrode 210. Accordingly, provided may be the opposite electrode 230 that covers the intermediate layer 220 (including an EML) on the pixel electrode 210, and from which a distance to the substrate 100 in at least a portion of the first discontinuous region of the first insulating layer 110 is shorter than the distance from the pixel electrode 210 to the substrate 100.

In an organic light-emitting display apparatus according to the present embodiment, of light emitted from the EML, light that is emitted toward not the substrate 100 but the side of the organic light-emitting display apparatus is reflected by the opposite electrode 230 on the discontinuous region $A_B$ to progress toward a front side of the substrate 100. Accordingly, light extraction efficiency is increased, and thus the brightness of the front side of the organic light-emitting display apparatus may be substantially increased. Also, the occurrence of blurring, such as mixing of color, that may occur between adjacent pixels (sub-pixels) may be more effectively prevented.

In an organic light-emitting display apparatus according to another embodiment of the present invention, as illustrated in FIG. 8, the second insulating layer 130, which is a gate insulating film disposed between the semiconductor layer 120 and the gate electrode 140, is formed to have the second discontinuous region corresponding to at least a portion of the first discontinuous region of the first insulating layer 110, so that the distance between the opposite electrode 230 and the substrate 100 in at least a portion of the second discontinuous region of the second insulating layer 130 is much shorter than the distance between the pixel electrode 210 and the substrate 100. By doing this, light extraction efficiency is further increased and the occurrence of blurring between adjacent pixels (sub pixels) may be further effectively reduced as compared to the organic light-emitting display apparatuses of the previous embodiment.

In this regard, the second insulating layer 130 and the first insulating layer 110 are simultaneously patterned to form the first discontinuous region and the second discontinuous region, and thus the edge surface of the second insulating layer 130 that is exposed by the second discontinuous region thereof may be flush with the edge surface of the first insulating layer 110 that is exposed by the first discontinuous region. According to another embodiment, however, the first discontinuous region and the second discontinuous region may be formed in different processes. In this case, however, the number of patterning processes increases. Accordingly, it may be desirable to form the first discontinuous region and the second discontinuous region simultaneously.

An organic light-emitting display apparatus according to another embodiment of the present invention may include, unlike the organic light-emitting display apparatus according to the previous embodiment described in connection with FIG. 5, and as illustrated in FIG. 11, the dummy semiconductor layer 120' that is disposed between the first insulating layer 110 and the opposite electrode 230 and that has an edge surface corresponding to, or substantially coplanar with, at least a portion of an edge surface of the first insulating layer 110 that is exposed by the first discontinuous region of the first insulating layer 110. In a more general case, the two edge surfaces can be two parts of a single continuous surface of any shape or profile.

The dummy semiconductor layer 120' may include polysilicon, which has a high transmission rate of about 50% with respect to visible light, and thus may effectively prevent blurring occurring between adjacent pixels. In particular, since the dummy semiconductor layer 120' is simultaneously formed together with the semiconductor layer 120 of the thin film transistor region $A_T$, an organic light-emitting display apparatus that displays an image with high quality without an additional process is embodied.

The dummy semiconductor layer 120' may be disposed at an opposite end of the first discontinuous region 110' as the pixel electrode 210. Alternatively, when the dummy semiconductor layer 120' is disposed adjacent to the pixel electrode 210, some light that is to be emitted toward the outside through the substrate 100 may be absorbed by the dummy semiconductor layer 120'.

The dummy semiconductor layer 120' may be applied to the organic light-emitting display apparatus according to the previous embodiment described in connection with FIG. 8. That is, an organic light-emitting device may further include, in addition to the structure of FIG. 8, the dummy semiconductor layer 120' that is disposed between the first insulating layer 110 and the second insulating layer 130 and that has an edge surface corresponding to, or substantially coplanar with, at least a portion of an edge surface exposed by the first discontinuous region of the first insulating layer 110. In a more general case, the two edge surfaces can be two parts of a single continuous surface of any shape or profile.

In an organic light-emitting display apparatus according to another embodiment of the present invention, unlike the organic light-emitting display apparatus according to the previous embodiment described in connection with FIG. 8, and as illustrated in FIG. 13, the third insulating layer 150, which is a gate insulating film disposed between the gate electrode 140 and the source and drain electrodes 161 and 162, is formed to have the third discontinuous region corresponding to at least a portion of the second discontinuous region of the second insulating layer 130, so that the distance between the opposite electrode 230 and the substrate 100 in at least a portion of the third discontinuous region of the third insulating layer 150 is much shorter than the distance between the pixel electrode 210 and the substrate 100, as compared to the organic light-emitting display apparatuses according to previous embodiments. By doing this, light extraction efficiency is further increased and the occurrence of blurring between adjacent pixels (sub pixels) may be further effectively reduced.

In this regard, when the first insulating layer 110, the second insulating layer 130, and the third insulating layer 150 are simultaneously patterned to form the first discontinuous region, the second discontinuous region, and the third discontinuous region, the edge surface of the second insulating layer 130 that is exposed by the second discontinuous region thereof may be flush or aligned with the edge surface of the first insulating layer 110 that is exposed by the first discontinuous region. In a more general case, the edge surfaces of these insulating layers can be seen as parts of a single continuous surface of any shape or profile. According to another embodiment, however, the first insulating layer 110, the second insulating layer 130, and the third insulating layer 150 may be formed in different processes. In this case, the number of patterning processes increases. Accordingly, it is desirable to form the first insulating layer 110, the second insulating layer 130, and the third insulating layer 150 simultaneously.

Also, an organic light-emitting display apparatus according to another embodiment of the present invention may further include, in addition to the structure of the organic light-emitting display apparatus described in connection with FIG. 13, a dummy semiconductor layer. That is, an organic light-emitting display apparatus may further include, in addition to the structure of FIG. 13, the dummy semiconductor layer 120' that is disposed between the first insulating layer 110 and the second insulating layer 130, and that has the edge surface corresponding to at least a portion of the edge surface exposed by the first discontinuous region of the first insulating layer 110. By doing this, an organic light-emitting display apparatus is formed in which blurring is further suppressed as compared to the organic light-emitting display apparatuses according to the previous embodiments.

According to an embodiment of the present invention, an organic light-emitting display apparatus having excellent light efficiency and a simpler manufacturing process embodied. However, these effects do not limit the scope of the present invention.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting display apparatus comprising:
   a substrate;
   a pixel electrode disposed on a pixel region of the substrate;
   a first insulating layer that is interposed between the substrate and the pixel electrode and that has a first discontinuous region extending along at least a portion of an edge of the pixel electrode, the first discontinuous region being a region in which material of the first insulating layer is not present;
   an intermediate layer that is disposed on the pixel electrode and that includes an emission layer; and
   an opposite electrode that covers the intermediate layer and at least a portion of the first discontinuous region, so that a shortest distance between the opposite electrode and the substrate in the at least a portion of the first discontinuous region is shorter than a shortest distance between the pixel electrode and the substrate.

2. The organic light-emitting display apparatus of claim 1, further comprising:
   a dummy semiconductor layer that is interposed between the first insulating layer and the opposite electrode and that has a surface that is at least approximately coplanar with a surface of the first insulating layer that is exposed by the first discontinuous region.

3. The organic light-emitting display apparatus of claim 2, wherein
   the dummy semiconductor layer is disposed at an opposite end of the first discontinuous region as the pixel electrode.

4. The organic light-emitting display apparatus of claim 1, wherein
   the first insulating layer is a buffer layer.

5. The organic light-emitting display apparatus of claim 1, further comprising:
   a second insulating layer that is interposed between the first insulating layer and the pixel electrode, and that has a second discontinuous region positioned to correspond to at least a portion of the first discontinuous region, the second discontinuous region being a region in which material of the second insulating layer is not present, wherein a shortest distance between the opposite electrode and the substrate in at least a portion of the second discontinuous region is shorter than a shortest distance between the pixel electrode and the substrate.

6. The organic light-emitting display apparatus of claim 5, wherein
the first insulating layer is a buffer layer and the second insulating layer is a gate insulating film.

7. The organic light-emitting display apparatus of claim 5, wherein
the second discontinuous region is positioned to correspond to the first discontinuous region of the first insulating layer, and a surface of the second insulating layer that is exposed by the second discontinuous region is at least approximately coplanar with an edge surface of the first insulating layer that is exposed by the first discontinuous region.

8. The organic light-emitting display apparatus of claim 5, further comprising:
a dummy semiconductor layer that is interposed between the first insulating layer and the second insulating layer, and that has a surface that is at least approximately coplanar with at least a portion of a surface of the first insulating layer that is exposed by the first discontinuous region.

9. The organic light-emitting display apparatus of claim 5, further comprising:
a third insulating layer that is interposed between the second insulating layer and the pixel electrode, and that has a third discontinuous region positioned to correspond to at least a portion of the second discontinuous region, the third discontinuous region being a region in which material of the third insulating layer is not present, wherein a shortest distance between the opposite electrode and the substrate in at least a portion of the third discontinuous region is shorter than a shortest distance between the pixel electrode and the substrate.

10. The organic light-emitting display apparatus of claim 9, wherein
the first insulating layer is a buffer layer, the second insulating layer is a gate insulating film, and the third insulating layer is an interlayer insulating film.

11. The organic light-emitting display apparatus of claim 9, wherein
each of the second discontinuous region and the third discontinuous region is positioned to corresponds to the first discontinuous region, and a surface of the second insulating layer that is exposed by the second discontinuous region and a surface of the third insulating layer that is exposed by the third discontinuous region are at least approximately coplanar with a surface of the first insulating layer that is exposed by the first discontinuous region.

12. The organic light-emitting display apparatus of claim 9, further comprising
a dummy semiconductor layer that is interposed between the first insulating layer and the second insulating layer, and that has a surface that is at least approximately coplanar with at least a portion of a surface of the first insulating layer that is exposed by the first discontinuous region.

13. The organic light-emitting display apparatus of claim 1, further comprising
a pixel-defining film that covers an edge of the pixel electrode to expose a central portion of the pixel electrode, and that has a fourth discontinuous region positioned to correspond to at least a portion of the first discontinuous region, the fourth discontinuous region being a region in which material of the pixel-defining film is not present, wherein the opposite electrode covers the pixel-defining film, and a shortest distance between the opposite electrode and the substrate in at least a portion of a fourth discontinuous region is shorter than a shortest distance between the pixel electrode and the substrate.

* * * * *